United States Patent
Taddiken et al.

(10) Patent No.: US 8,587,361 B2
(45) Date of Patent: Nov. 19, 2013

(54) RF SWITCH CIRCUIT INCLUDING A SERIES CONNECTION OF A PLURALITY OF TRANSISTORS, RF SWITCH INCLUDING AN RF SWITCH CIRCUIT AND METHOD FOR SWITCHING RF SIGNALS

(75) Inventors: Hans Taddiken, Munich (DE); Thomas Boettner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 47 days.

(21) Appl. No.: 13/247,233

(22) Filed: Sep. 28, 2011

(65) Prior Publication Data
US 2013/0076429 A1    Mar. 28, 2013

(51) Int. Cl.
*H03K 17/687* (2006.01)

(52) U.S. Cl.
USPC ............ 327/427; 327/434; 327/436; 327/437

(58) Field of Classification Search
USPC .................................. 327/427, 434, 436, 437
See application file for complete search history.

(56) References Cited

U.S. PATENT DOCUMENTS

| 3,521,087 | A  | * | 7/1970  | Lombardi ..................... 327/322 |
| 7,286,001 | B2 | * | 10/2007 | Nakatsuka et al. ........... 327/308 |
| 7,460,852 | B2 |   | 12/2008 | Burgener et al. |
| 7,692,473 | B2 | * | 4/2010  | Ono .............................. 327/427 |
| 7,796,969 | B2 |   | 9/2010  | Kelly et al. |
| 8,093,940 | B2 | * | 1/2012  | Huang et al. .................. 327/430 |
| 2006/0118884 | A1 |  | 6/2006  | Losehand et al. |
| 2006/0194567 | A1 |  | 8/2006  | Kelly et al. |
| 2007/0120103 | A1 |  | 5/2007  | Burgener et al. |
| 2009/0117871 | A1 |  | 5/2009  | Burgener et al. |

* cited by examiner

*Primary Examiner* — Kenneth B. Wells
(74) *Attorney, Agent, or Firm* — Slater & Matsil, L.L.P.

(57) ABSTRACT

An RF switch circuit for switching RF signals includes a first terminal and a second terminal and a series connection of a plurality of transistors between the first terminal of the RF switch circuit and the second terminal of the RF switch circuit. Furthermore, the RF switch circuit includes a control circuit configured to conductively couple, in a high impedance state of the RF switch circuit, the first terminal of the RF switch circuit to a control terminal of a first transistor in a series of the series connection of the plurality of transistors. The second terminal of the RF switch circuit is conductively coupled to a control terminal of a last transistor in the series of the series connection of the plurality of transistors.

22 Claims, 7 Drawing Sheets

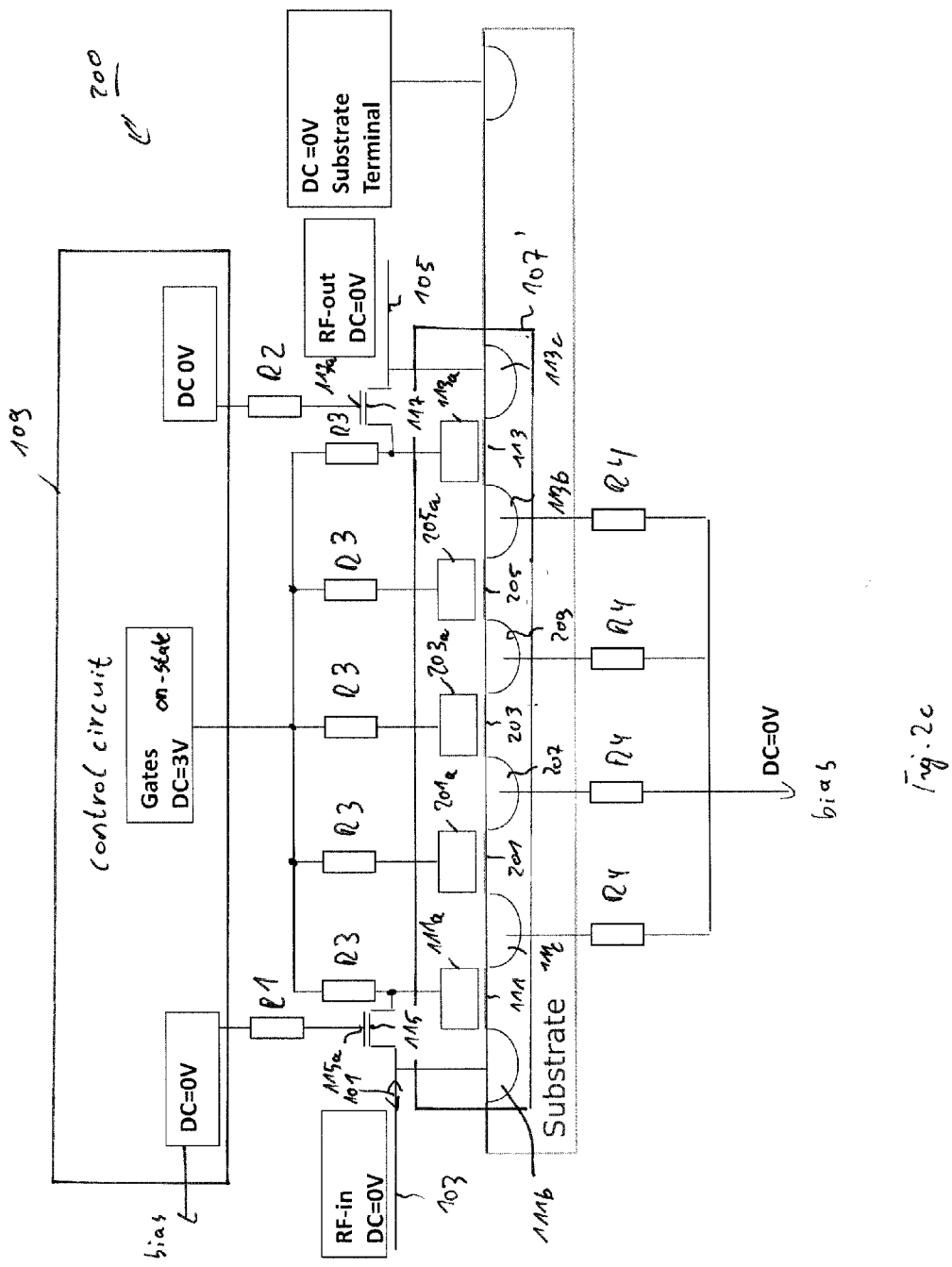

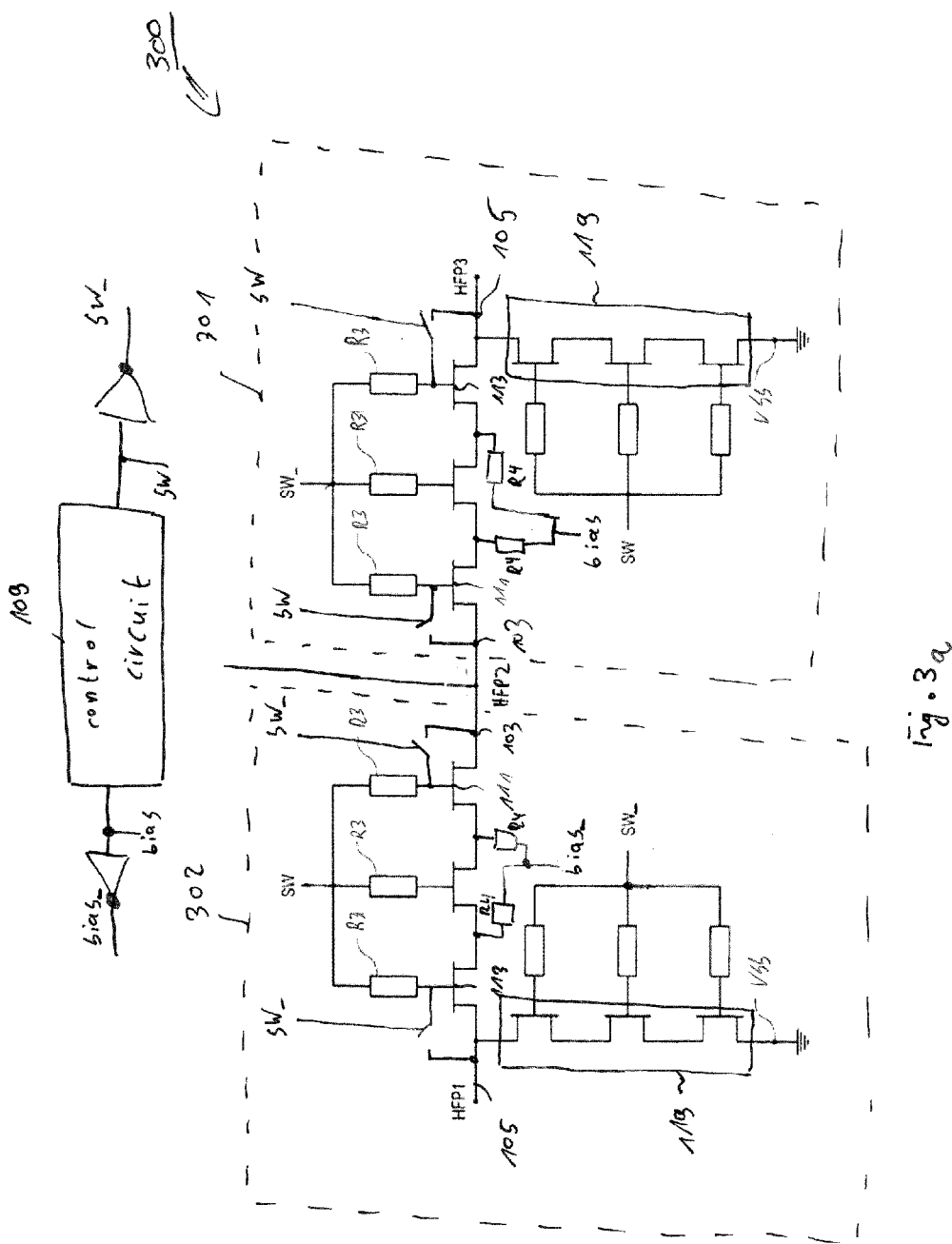

400

Conductively coupling, in a high impedance state of the RF
switch circuit, the first terminal of the RF switch circuit to
a control terminal of a first transistor in the series of the  — 401
series connection of the plurality of transistors and the
second terminal of the RF switch circuit to a control terminal
of a last transistor in the series of the series connection of
the plurality of transistors.

RF SWITCH CIRCUIT INCLUDING A SERIES CONNECTION OF A PLURALITY OF TRANSISTORS, RF SWITCH INCLUDING AN RF SWITCH CIRCUIT AND METHOD FOR SWITCHING RF SIGNALS

TECHNICAL FIELD

Embodiments of the present invention relate to an RF switch circuit. Further embodiments of the present invention relate to an RF switch comprising such an RF switch circuit, which may be used as a frontend switch in mobile phones.

BACKGROUND

An RF switch should comprise a small insertion loss, high power stability and a good linearity. A conventional switch can be built based on silicon. For this a charge pump on the chip is required, because gates in deactivated branches have to be biased with a negative voltage to ensure voltage stability. Furthermore, the substrate has to be biased with a negative voltage when compared to the source drain nodes of the transistors, such that the linearity of the transistors is ensured. The disadvantage is the integration of the charge pump, which consumes area and additional process steps, which results in a more expensive chip.

SUMMARY OF THE INVENTION

Embodiments of the present invention provide an RF switch circuit for switching RF signals. The RF switch circuit comprises a first terminal and a second terminal. Furthermore, the RF switch circuit comprises a series connection of a plurality of transistors between the first terminal of the RF switch circuit and the second terminal of the RF switch circuit.

Furthermore, the RF switch circuit comprises a control circuit configured to conductively couple, in a high impedance state of the RF switch circuit, the first terminal of the RF switch circuit to a control terminal of a first transistor in a series of the series connection of the plurality of transistors. Furthermore, the control circuit is configured to conductively couple, in the high impedance state of the RF switch circuit, the second terminal of the RF switch circuit to a control terminal of a last transistor in the series of the series connection of the plurality of transistors.

BRIEF DESCRIPTION OF THE DRAWINGS

Embodiments of the present invention will be described in the following using the accompanying figures, in which:

FIG. 2c shows the RF switch circuit from FIG. 2a in the on-state;

FIG. 3a shows a schematic illustration of an RF switch according to a further embodiment of the present invention;

FIG. 4 shows a flow diagram of a method according to a further embodiment of the present invention.

DETAILED DESCRIPTION OF ILLUSTRATIVE EMBODIMENTS

Before embodiments of the present invention will be described in detail using the accompanying figures it is to be pointed out that the same or functionally equal elements are provided with the same reference numbers. Hence, descriptions provided for elements having the same reference numbers are mutually exchangeable.

In the present application the meaning of coupling is in the sense of a direct low impedance coupling and an indirect coupling with one or more elements in-between, such that a signal at a second node is dependent on a signal at a first node which is coupled to the second node. In other words, further elements, especially switching elements (like transistors) or drivers, may be placed between two coupled elements. Between two coupled elements an additional element may be placed, but not necessarily need to, therefore two coupled elements may be directly connected (using a low impedance connection, like a wire or a trace or a conductor path).

Figure 1:
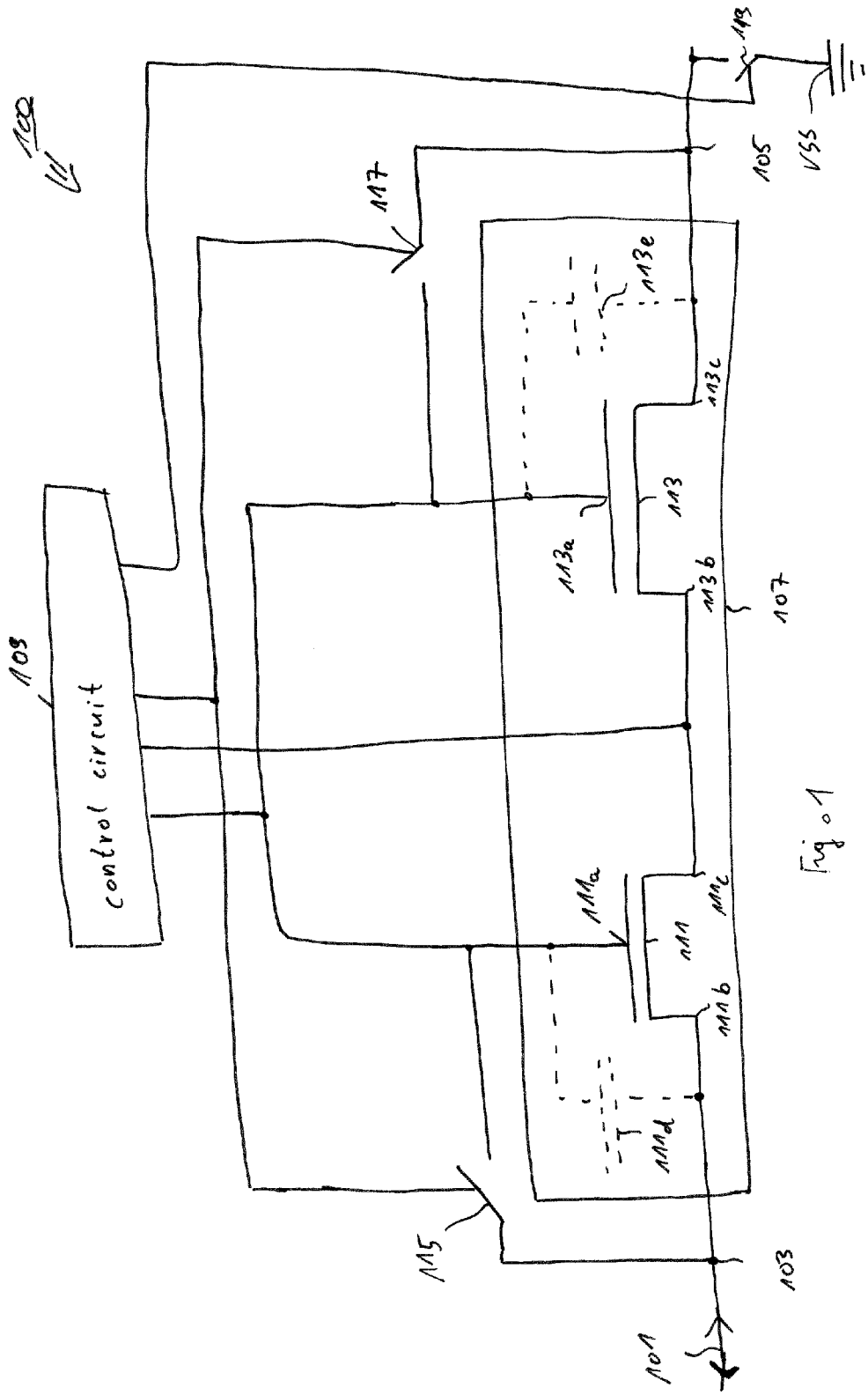
FIG. 1 shows a schematic illustration of an RF switch circuit according to an embodiment of the present invention.

FIG. 1 shows a schematic illustration of an RF switch circuit 100 for switching RF signals 101 according to an embodiment of the present invention. The RF switch circuit 100 comprises a first terminal 103 and a second terminal 105. Furthermore, the RF switch circuit 100 comprises a series connection 107 of a plurality of transistors between the first terminal 103 of the RF switch circuit 100 and the second terminal 105 of the RF circuit 100.

Furthermore, the RF switch circuit 100 comprises a control circuit 109 configured to conductively couple, in a high impedance state (or a non-conductive state) of the RF switch circuit 100, the first terminal 103 of the RF switch circuit 100 to a control terminal 111a of a first transistor 111 in a series of the series connection 107 of the plurality of transistors. Furthermore, the control circuit 109 is configured to couple, in the high impedance state of the RF switch circuit 100, the second terminal 105 of the RF switch circuit 100 to a control terminal 113a of a last transistor 113 in the series of the series connection 107 of the plurality of transistors.

The first transistor 111 of the series connection 107 comprises the control terminal 111a, a first terminal 111b and a second terminal 111c. The last transistor 113 of the series connection 107 comprises the control terminal 113a, a first terminal 113b and a second terminal 113c. A channel of the first transistor 111 of the series connection 107 extends between the first terminal 111b and the second terminal 111c of the first transistor 111 of the series connection 107 and a channel of the last transistor 113 of the series connection 107 extends between the first terminal 113b and the second terminal 113c of the last transistor 113 of the series connection 107. The control circuit 109 may be configured to bring the channels of the first transistor 111 and the last transistor 113 of the series connection 107 into a high impedance state (or a non-conductive state) by applying a first potential (e.g., ground potential for n channel transistors) and to bring the channels of the first transistor 111 and the last transistor 113 of the series connection 107 into a low impedance state (or conductive state) by applying a second potential (e.g., supply potential for n channel transistors) to the control terminals 111a, 113a of the first transistor 111 and the last transistor 113 of the series connection 107. During the high impedance state of the channels of the first transistor 111 and the last transistor 113 of the series connection 107 the RF switch circuit is in its high impedance state, i.e., no RF signals 101 can be routed from the first terminal 103 to the second terminal 105 of the RF switch circuit 100 or in the other direction.

In the low impedance state of the channels of the first transistor 111 and the last transistor 113 of the series connection 107 the RF switch circuit 100 is in its low impedance state, i.e., RF signals 101 may be routed from the first terminal 103 to the second terminal 105 or in the other direction from the second terminal 105 to the first terminal 103 of the RF switch circuit 100.

The first terminal 103 of the RF switch circuit 100 may be coupled to the first terminal 111b of the first transistor 111 of the series connection 107 or may be formed by the first terminal 111b of the first transistor 111 of the series connection 107, such that, in the high impedance state of the RF switch circuit 100 (when the control terminal 111a of the first transistor 111 of the series connection 107 is conductively coupled to the first terminal 103 of the RF switch circuit 100), the control terminal 111a and the first terminal 111b of the series connection 107 are shortened.

Hence, a parasitic capacitance 111d between the control terminal 111a and the first terminal 111b of the first transistor 111 of the series connection 107 is bypassed. This parasitic capacitance 111d may be a gate source capacitance of the first transistor 111 of the series connection 107.

Furthermore, the second terminal 105 of the RF switch circuit 100 may be coupled to the second terminal 113c of the last transistor 113 of the series connection 107 or may be formed by the second terminal 113c of the last transistor 113 of the series connection 107, such that, in the high impedance state of the RF switch circuit 100 (during which the control terminal 113a of the last transistor 113 of the series connection 107 is conductively coupled to the second terminal 105 of the RF switch circuit 100), a parasitic capacitance 113e (e.g., a gate drain capacitance) between the control terminal 113a and the second terminal 113c of the last transistor 113 of the series connection 107 is bypassed.

This bypassing of the parasitic capacitances 111d, 113e at the terminals 103, 105, which may be an input terminal and an output terminal of the RF switch circuit 100 enables a biasing of inner terminals 111c, 113b of the plurality of transistors of the series connection 107 with a positive potential (e.g., supply potential). In the example shown in FIG. 1 the inner terminals of the plurality of transistors of the series connection 107 are the second terminal 111c of the first transistor 111 and the first terminal 113b of the last transistor 113 of the series connection 107. The first terminal 111b of the first transistor 111 and the second terminal 113c of the last transistor 113 of the series connection 107 form outer terminals of the series connection 107.

By biasing the inner terminals 111c, 113b of the plurality of transistors of the series connection 107, a negative voltage of the substrate when compared to the inner terminals 111c, 113b (which may be source drain nodes or source drain areas) can be achieved without the need for a negative substrate biasing of the substrate of the plurality of transistors of the series connection 107.

Hence, an area consuming and current consuming charge pump for generating a negative bias potential can be omitted in the RF switch circuit 100.

By conductively coupling, during the high impedance state of the RF switch circuit 100, the control terminal 111a of the first transistor 111 of the series connection 107 to the first terminal 103 of the RF switch circuit 100, it is achieved that, even with the positive biasing of the inner terminals 111c, 113b of the plurality of transistors of the series connection 107, the channel of the first transistor 111 of the series connection 107 stays in its high impedance state for the complete range of the RF signals 101. The same applies for the last transistor 113 of the series connection 107.

Without the principle shown in FIG. 1 of shortening the control terminals 111a, 113a of the outer transistors 111, 113 of the series connection 107 with the terminals 103, 105 of the RF switch circuit 100, it could happen that for certain voltages of the RF signal 101, channels of the outer transistors 111, 113 would switch between the high impedance state and the low impedance state with the frequency of the RF signals 101. Hence, harmonics would be generated which would decrease the performance of the RF switch circuit. But as described above, this is prevented by conductively coupling or connecting the control terminals 111a, 113a (or gates 111a, 113a) of the outer transistors 111, 113 of the series connection 107 with the terminals 103, 105 of the RF switch circuit 100.

Hence, no harmonics are generated during the high impedance state of the RF switch circuit 100. Furthermore, a high linearity of the RF switch circuit 100 is achieved by biasing the inner terminals 111c, 113b of the plurality of transistors of the series connection 107 with a higher potential than a potential of the substrate of the plurality of transistors of the series connection 107.

Hence, the substrate of the plurality of transistors of the series connection 107 can be conductively coupled, in the high impedance state of the RF switch circuit 100 and in the low impedance state of the RF switch circuit 100, to a ground terminal VSS of the RF switch circuit 100, at which a ground potential is provided. In other words, the substrate may permanently have ground potential.

The control circuit 109 may be configured to conductively couple the control terminal 111a of the first transistor 111 of the series connection 107 to the first terminal 103 of the RF switch circuit 100 by means of a first switch or switching element 115. The control circuit 109 may bring the first switch 115 into a low impedance state (or conductive state) during the high impedance state of the RF switch circuit 100 for conductively coupling the first terminal 103 of the RF switch circuit 100 and the control terminal 111a of the first transistor 111 of the series connection 107. Furthermore, in the low impedance state of the RF switch circuit 100, the control circuit 109 may conductively decouple the control terminal 111a of the first transistor 111 of the series connection 107 and the first terminal 103 of the RF switch 100, e.g., by bringing the first switch 115 into a high impedance state (or a non conductive state).

Furthermore, the control circuit 109 may be configured to conductively couple the control terminal 113a of the last transistor 113 of the series connection 107 to the second terminal 105 of the RF switch circuit 100 by means of a second switch 117 or switching element 117. Hence, during the high impedance state of the RF switch circuit 100, the control circuit 109 may bring the second switch 117 into a low impedance state (or conductive state), for conductively coupling the control terminal 113a of the last transistor 113 of the series connection 107 to the second terminal 105 of the RF switch 100. Furthermore, the control circuit 109 may be configured to conductively decouple, in the low impedance state of the RF switch circuit 100, the control terminal 113a of the last transistor 113 of the series connection 107 and the second terminal 105 of the RF switch circuit 100, e.g., by bringing the second switch 117 into a high impedance state (or a non conductive state).

According to further embodiments, the control circuit 109 may be configured to conductively couple, in the high impedance state of the RF switch circuit 100, the second terminal 105 of the RF switch circuit 100 to the ground terminal VSS of the RF switch circuit 100 at which the ground potential is provided. As an example, the RF switch circuit 100 may comprise a shunt switch 119 coupled between the ground terminal VSS and the second terminal 105 of the RF switch circuit 100, which is controlled by the control circuit 109, such that the control circuit 109 brings the shunt switch 119 into a low impedance state (or conductive state) during the high impedance state of the RF switch circuit 100 and into a high impedance state (or a non conductive state) during the low impedance state of the RF switch circuit 100. As an example, the shunt switch 119 may be realized by a further series connection of a further plurality of transistors coupled between the second terminal 105 of the RF switch 100 and the ground terminal VSS.

The control circuit 109 may be configured to bring, in the high impedance state of the RF switch circuit 100, channels of this further plurality of transistors into a conductive state and to bring, in the low impedance state of the RF switch circuit 100, the channels of the further plurality of transistors into a non conductive state.

According to further embodiments, the control circuit 109 may be configured to bring, in the low impedance state of the RF switch circuit 100 (when RF signals can be routed from the first terminal 103 to the second terminal 105 of the RF switch circuit 100 or vice versa), the second terminal 111c of the first transistor 111 of the series connection 107 and the first terminal 113b of the last transistor 113 of the series connection 107 into an unbiased state. In other words, in the low impedance state of the RF switch circuit 100, the control circuit 109 may remove the biasing of the inner terminals 111c, 113b of the plurality of transistors of the series connection 107.

In the following, a more detailed example of embodiments of the present invention is given using the FIGS. 2a to 2c.

The voltages and potentials named in the following always refer to the ground potential having 0 volts. In the following a supply potential of +3 volts is assumed and a ground potential of 0 volts is assumed. Furthermore, it is assumed that the RF signals 101 have a maximum amplitude of +3 volts and a minimum amplitude of −3 volts.

Figure 2A:
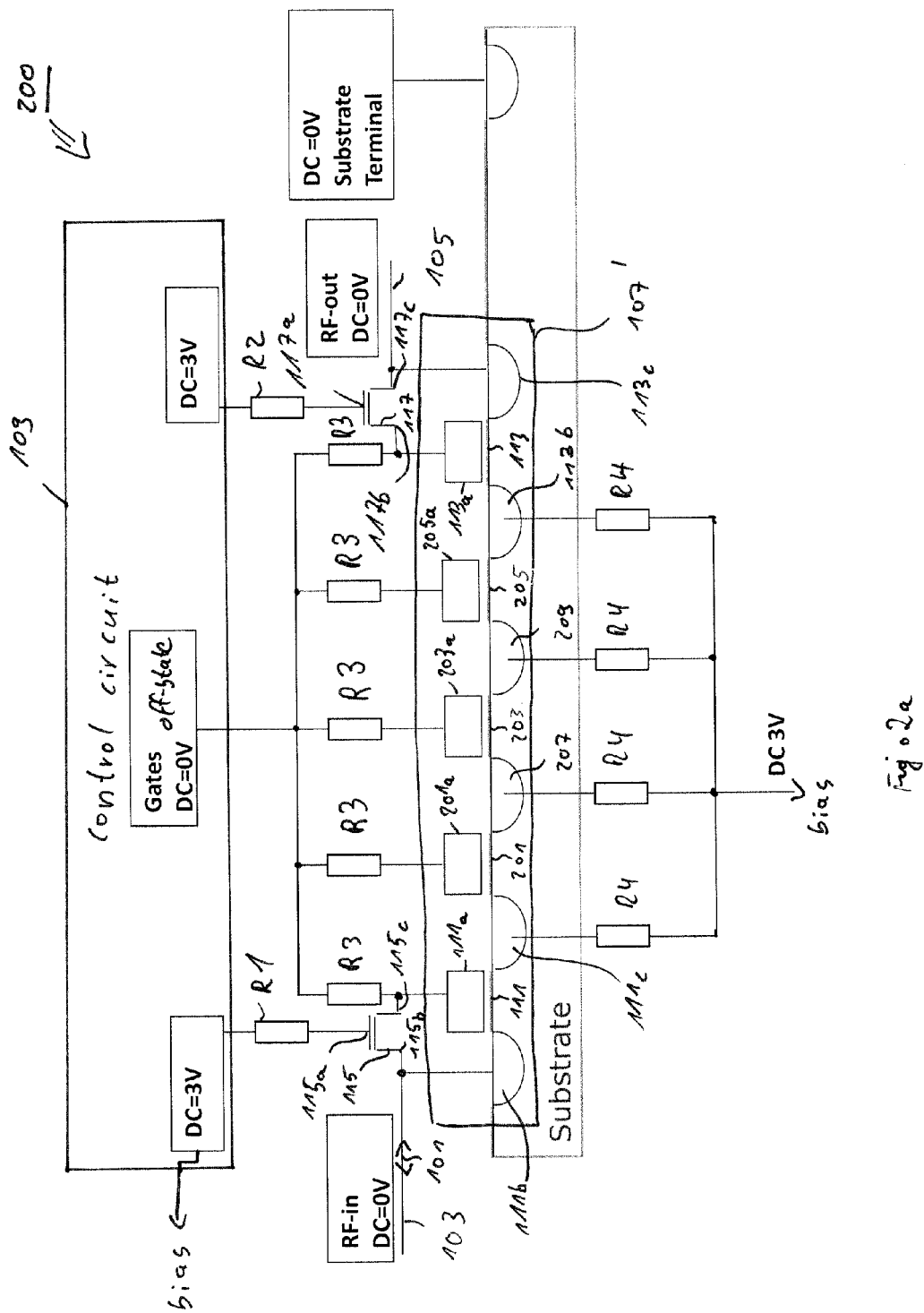
FIG. 2a shows a schematic illustration of an RF switch circuit according to a further embodiment of the present invention in an off-state.

FIG. 2a shows a schematic illustration of an RF switch circuit 200 according to a further embodiment of the present invention, the RF switch circuit 200 extends the RF switch circuit 100 in that a series connection 107' of the RF switch 200 comprises three additional inner transistors 201, 203, 205 which are in a series of the series connection 107' arranged between the first transistor 111 and the last transistor 113 of the series connection 107'.

In general, the number of inner transistors may be chosen arbitrarily and may be equal to or larger than 0.

The control circuit 109 may be coupled to control terminals 111a, 201a, 203a, 205a, 113a of the plurality of transistors 111, 201, 203, 205, 113 of the series connection 107' by means of resistors R3.

As can be seen from FIG. 2a inner terminals 111c, 207, 209, 113b or source drain areas of the plurality of transistors 111, 201, 203, 205, 113 of the series connection 107' are shared by two transistors. Hence, each of the inner terminals 111c, 207, 209, 113b of the series connection 107' forms a source region for a transistor and a drain region for another transistor.

The control circuit 109 may be coupled to the inner terminals or inner source drain nodes 111c, 207, 209, 113b by means of resistors R4.

As an example, the inner terminal 111c may form a drain region of the first transistor 111 and a source region of a second transistor 201 being arranged in the series of the series connection 107' subsequent to the first transistor 111 of the series connection 107'. Furthermore, the inner terminal 113b may form a drain region of a third transistor 205 being arranged in the series of the series connection 107' directly before the last transistor 113 and may form a source region of the last transistor 113 of the series connection 107'.

As can be seen, the inner terminals 111c, 207, 209, 113b or inner source drain regions of the plurality of transistors 111, 201, 203, 205, 113 of the series connection 107' can be biased by the control circuit 109.

In the example shown in FIG. 2a, the RF switch circuit 200 is shown in its off-state or high impedance state. Hence, in this high impedance state, as described before, the control circuit 109 may be configured to bias the inner terminals 111c, 113b, 207, 209 of the plurality of transistors of the series connection 107' with a positive supply potential (in the case shown in FIG. 2a 3 volts).

Furthermore, in the example shown in FIG. 2a, the first switch 115 is formed by a first switching transistor 115, a first terminal 115b of which is connected to the first terminal 103 of the RF circuit 200 and a second terminal 115c of which is connected to the control gate 111a of the first transistor 111 of the series connection 107'. A control terminal 115a of the first switching transistor 115 is coupled, e.g., by means of a first resistor R1 to the control circuit 109.

Furthermore, the second switch 117 is formed by a second switching transistor 117, a first terminal 117b of which is connected to the control terminal 113a of the last transistor 113 of the series connection 107' and a second terminal 117c of which is connected to the second terminal 105 of the RF switch circuit 200. A control terminal 117a of the second switching transistor 117 is coupled, e.g., by means of a second resistor R2 to the control circuit 109.

The control circuit 109 may be configured to conductively couple, in the high impedance state of the RF switch circuit 200, as shown in FIG. 2a, the control terminal 111a of the first transistor 111 of the series connection 107' and the first terminal 103 of the RF switch circuit 200 by applying a suitable potential to the control terminal 115a of the first switching transistor 115, such that the first switching transistor 115 is brought into its low impedance state.

Furthermore, the control circuit 109 may be configured to conductively couple, in the high impedance state of the RF switch circuit 200, the control terminal 113a of the last transistor 113 of the series connection 107' and the second terminal 105 of the RF switch circuit 200 by applying a suitable voltage to the control terminal 117a of the second switching transistor 117, such that the second switching transistor 117 is brought into its low impedance state.

In the example shown in FIG. 2a, the switching transistors 115, 117 are n channel transistors. Hence, the control circuit 109 is configured to apply the positive supply potential to the switching transistor 115, 117 for bringing them into their low impedance states.

Furthermore, the plurality of transistors of the series connection 107' may be n channel transistors. Hence, the control circuit 109 may be configured to apply ground potential to the control terminals 111a, 201a, 203a, 205a, 113a of the plurality of transistors 111, 201, 203, 205, 113 to bring their channels into their high impedance states.

Figure 2B:
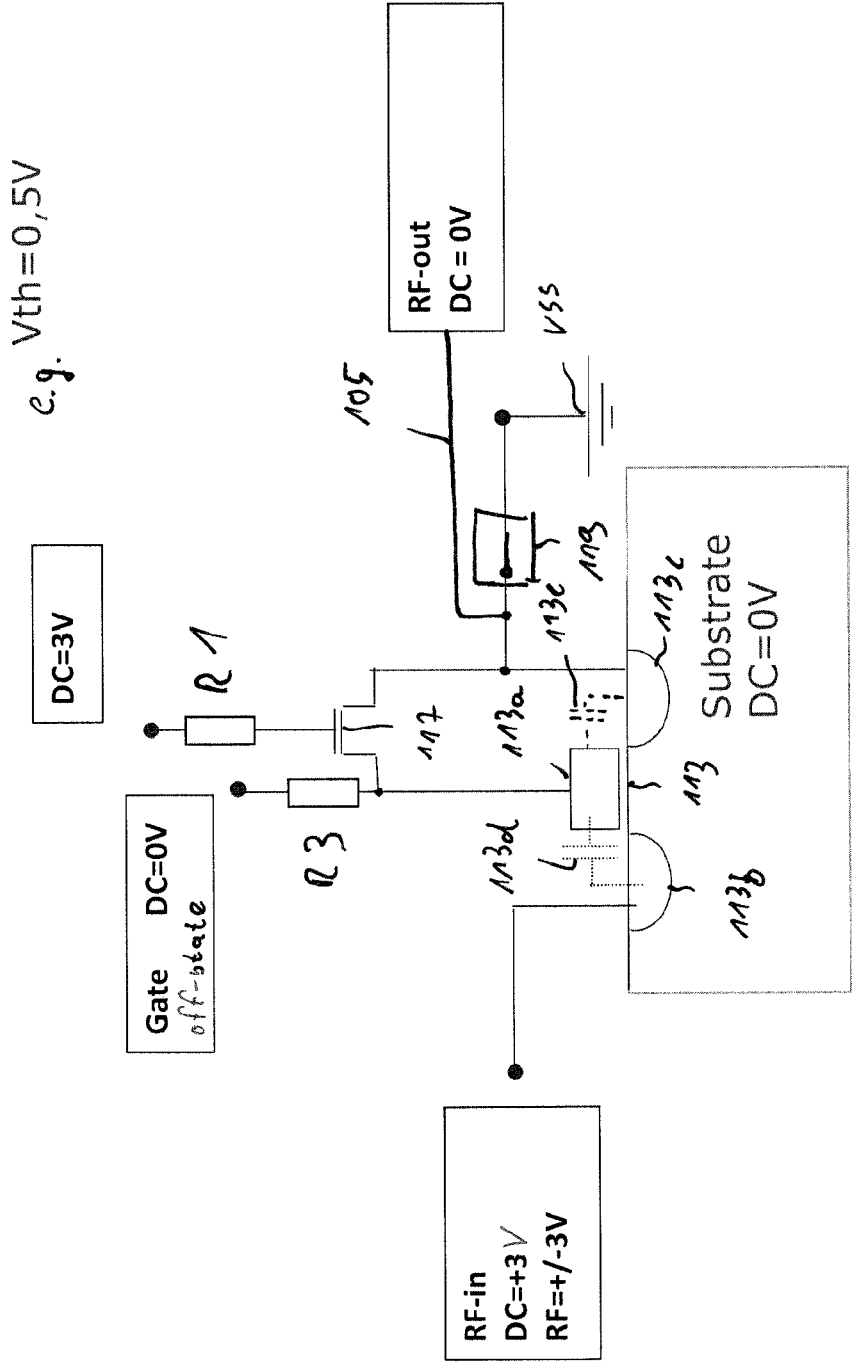
FIG. 2b shows a more detailed illustration of the voltages which can occur at a last transistor in a series of a series connection of the RF switch circuit from FIG. 2a in the off-state.

FIG. 2b shows the last transistor 113 of the series connection 107' during the off-state condition of the RF switch circuit 200. Hence, the second switching transistor 117 is in a low impedance state and conductively couples the control terminal 113a of the last transistor 113 of the series connection 107' and the second terminal 113c of the last transistor 113 of the series connection 107' (and the second terminal 105 of the RF switch circuit 200). Hence, the gate drain capacitance 113e of the last transistor 113 of the series connection 107' between the control terminal 113a and the second terminal 113c of the last transistor 113 is bypassed.

In a further embodiment of the present invention, the second terminal 113c of the last transistor 113 of the series connection 107' may be pulled to ground potential by means of the shunt switch 119 or the shunt path 119, during the high impedance state of the RF switch circuit 200, the gate terminal 113a of the last transistor 113 of the series connection 107' has also ground potential independent of a potential at the first terminal 113b of the last transistor 113 of the series connection 107'.

As can be seen from FIG. 2b a source gate capacitance 113d of the last transistor 113 of the series connection 107' is not bypassed. Furthermore, the first terminal 113b of the last transistor 113 of the series connection 107' is biased with the supply potential (in this case +3 volts).

A maximum amplitude of the RF signal at the first terminal 113b of the last transistor 113 of the series connection 107' may be +3 volts and a minimum amplitude may be −3 volts.

To limit the voltages of the RF signal to these values, the RF switch circuit 200 may comprise a voltage limiter, for example, at the first terminal 103 of the RF switch circuit 200.

It is to be pointed out that by having the series connection 107' of the plurality of transistors 111, 201, 203, 205, 113 the RF voltage or the voltage of an RF signal, e.g., at the first terminal 103 or the second terminal 105 is divided over the plurality of transistors 111, 201, 203, 205, 113, such that at each transistor 111, 201, 203, 205, 113 only a (small) RF-voltage occurs which does not exceed the threshold voltage of the transistors 111, 201, 203, 205, 113 (so called stacking of transistors). This series connection 107' of the plurality of transistors 111, 201, 203, 205, 113 in the off-state can be described with a series connection of capacitances, in which each capacitance represents a Drain-Gate-capacitance or a Gate-Source-capacitance of a transistor of the plurality of transistors 111, 201, 203, 205, 113. The high frequency (signal) is divided approximately linear, such that at each transistor 111, 201, 203, 205, 113 only a small voltage drop occurs. The more transistors are connected (or stacked) in series, the smaller the voltage at each transistor.

In the example shown in FIG. 2b the positive half wave of the RF signal results in a maximum gate source voltage between the gate terminal 113a and the first terminal 113b of the last transistor 113 of:

0 volts−6 volts=−6 volts.

The negative half wave of the RF signal results in a maximum gate source voltage of:

0 volts−0 volts=0 volts.

Furthermore, the positive half wave of the RF signal results in a maximum gate drain voltage between the control terminal 113a and the second terminal 113c of the last transistor 113 of:

0 volts−0 volts=0 volts.

The negative half wave of the RF signal results in a maximum gate drain voltage of:

0 volts−0 volts=−0 volts.

As can be seen, even with a small threshold voltage, e.g. VTH=0.5 volts, the last transistor 113 remains in its non conductive state for the complete range of the incoming RF signal.

As an example, in the following it is described what would happen if the gate drain capacitance 113e would not be bypassed by the second switching transistor 117.

In this case, the positive half wave of the incoming RF signal would result in a maximum gate source voltage of:

1.5 volts−6 volts=−4.5 volts.

The negative half wave of the RF signal would result in a maximum gate source voltage of:

−1.5 volts−0 volts=−1.5 volts.

Furthermore, the positive half wave of the incoming RF signal would result in a maximum gate drain voltage of:

1.5 volts−0 volts=1.5 volts.

In this case, due to the higher potential at the gate terminal 113a when compared to the second terminal 113c the transistor 113 would open, i.e., the channel of the last transistor 113 would become conductive. This would generate harmonics in the RF switch circuit.

As described before, this problem is solved by bypassing the gate drain capacitance 113e of the last transistor 113 by means of the second switching transistor 117.

The same principle as described in FIG. 2b applies vice versa for the first transistor 111 in conjunction with the first switching transistor 115.

FIG. 2c shows the RF switch circuit 200 from FIG. 2a in the low impedance state or on-state. In this low impedance state the control circuit 109 applies suitable voltages to the control terminal 115a of the first switching transistor 115 and to the control terminal 117a of the second switching transistor 117, such that the first switching transistor 115 and the second switching transistor 117 are in the high impedance states. In the example shown in FIG. 2c the control circuit 109 applies ground potential to the control terminals 115a, 117a.

Furthermore, the control circuit 109 applies suitable voltages to the control terminals 111a, 201a, 203a, 205a, 113a of the plurality of transistors of the series connection 107' for bringing the plurality of transistors (or their channels) in the conductive state, such that RF signals 101 can be routed from the first terminal 103 of the RF switch circuit 200 to the second terminal 105 of the RF switch circuit 200 or vice versa. In the example shown in FIG. 2c, the control circuit 109 applies supply potential to the control terminals 111a, 201a, 203a, 205a, 113a.

Furthermore, in the low impedance state of the RF switch circuit 200, the control circuit 109 keeps the inner terminals 111c, 207, 209, 113b in an unbiased state.

As can be seen from FIGS. 2a and 2c, a substrate terminal of the substrate of the plurality of transistors is not biased, i.e., has ground potential in the high impedance state of the RF switch circuit 200 and in the low impedance state of the RF switch circuit 200. Hence, no charge pump is needed for producing a negative biasing potential for the substrate.

To summarize, in the RF switch circuit 200, the inner source drain areas or terminals 111c, 207, 209, 113b are biased with a positive voltage (during the high impedance state of the RF switch circuit 200). This leads to a bias when compared to the substrate of the plurality of transistors. The outer terminals or outer nodes, 111b, 113c of the outer transistors 111, 113 of the series connection 107' still have 0 volts. To prevent that the outer transistors 111, 113 with a low threshold voltage Vth (e.g., of 0.5 volts) switch on in response to a certain amplitude of the RF signals 101, which would generate harmonics, the gate terminals 111a, 113a of the outer transistors 111, 113 are connected to their outer source drain nodes 111b, 113c with the switching transistors 115, 117.

In the on state of the RF switch circuit 200, no voltage exists between the inner source drain nodes 111c, 207, 209, 113b and the substrate.

To summarize, in the case that the plurality of transistors of the series connection 107' are n channel transistors, the control circuit 109 may be configured to apply, in the high impedance state of the RF switch circuit 200, the ground potential to the control terminal 111a of the first transistor 111 and to the control terminal 113a of the last transistor 113. Furthermore the control circuit 109 is configured to apply the positive supply potential (or a positive bias potential) to the inner terminals 111c, 207, 209, 113b. The positive bias potential can be chosen such that a difference between a maximum RF signal potential (in the example in FIG. 2a e.g. +3 volts) at the first terminal 111b of the first transistor 111 and the positive bias potential is smaller than the threshold voltage of the first transistor 111.

Furthermore, the positive bias potential may be chosen such that a difference between the ground potential and a sum of the bias potential and the minimum RF signal potential (in the example shown in FIG. 2a −3 volts) at the first terminal 113b of the last transistor 113 is smaller than the threshold voltage of the last transistor 113. By choosing the positive bias potential as described above, it can be achieved, that for the complete range of the RF signals 101, the first transistor 111 and the last transistor 113 stay, during the high impedance state of the RF switch circuit 200, in their high impedance states.

As mentioned before, the maximum voltage and the minimum voltage of the RF signals 101 may be limited by a voltage limiter of the RF switch circuit 200, for example coupled to the first terminal 103 of the RF switch circuit 200 or to the second terminal 105 of the RF switch circuit 200 or may be limited by design or an application of the RF switch circuit 200.

In an application of the RF switch circuit 200, the RF switch circuit 200 may be switched between an antenna for receiving and/or transmitting RF signals 101 and a receive or transmit branch of a receiver or transmitter. As an example, the antenna may be coupled to the first terminal 103 of the RF switch circuit and the transmit or receive branch of the transmitter or receiver may be coupled to the second terminal 105 of the RF switch circuit.

In some applications an RF switch may be used for switching between a transmit part and a receive part, for this the RF switch may comprise two RF switch circuits. FIG. 3a shows such an RF switch 300 according to an embodiment of the present invention. The RF switch 300 comprises a first RF switch circuit 301 and a second RF switch circuit 302. A first terminal 103 of the first RF switch circuit 301 and a first terminal 103 of the second RF switch circuit 302 are coupled to a common terminal (e.g. antenna terminal) HFP2 of the RF switch 300. A second terminal 105 of the first RF switch circuit 301 is coupled to a first transmitter/receiver terminal HFP3 of the RF switch 300. A second terminal 105 of the second RF switch circuit 302 is coupled to a second transmitter/receiver terminal HFP1 of the RF switch 300.

In the example shown in FIG. 3a, the first RF switch circuit 301 and the second RF switch circuit 302 are identical with the only difference that control signals SW, SW_ for the transistors and switches of the first RF switch circuit 301 are inverted to the control signals SW_, SW of the corresponding switches and transistors in the second RF switch circuit 302. Hence, when the first RF switch circuit 301 is in its high impedance state, the second RF switch circuit 302 is in its low impedance state and when the second RF switch circuit 302 is in its high impedance state, the first RF switch circuit 301 is in its low impedance state. The RF switch circuit 301, 302 differ from the RF switch circuit shown in FIG. 1 in that the number of transistors in the series connection is three instead of two as shown in FIG. 1 and in that the shunt switches 119 of the RF switch circuit 301, 302 are each implemented with a further series connection of a further plurality of transistors coupled between the ground terminal VSS and the second terminals 105 of the RF switch circuits 301, 302. Furthermore, the RF switch 300 comprises a common control circuit 109 for controlling the first RF switch circuit 301 and the second RF switch circuit 302.

Furthermore, the control circuit 109 provides the biasing potentials for the inner nodes of the plurality of transistors of the series connection of the first RF switch circuit 301 and the second RF switch circuit 302. As can be seen from FIG. 3a, the biasing for the first RF switch circuit 301 is inverted to the biasing of the second RF switch circuit 302. Hence, the inner nodes of the plurality of transistors of the series connection of the first RF switch circuit 301 are biased when the inner nodes of the plurality of transistors of the series connection of the second RF switch circuit 302 are in an unbiased state and vice versa.

Figure 3B:
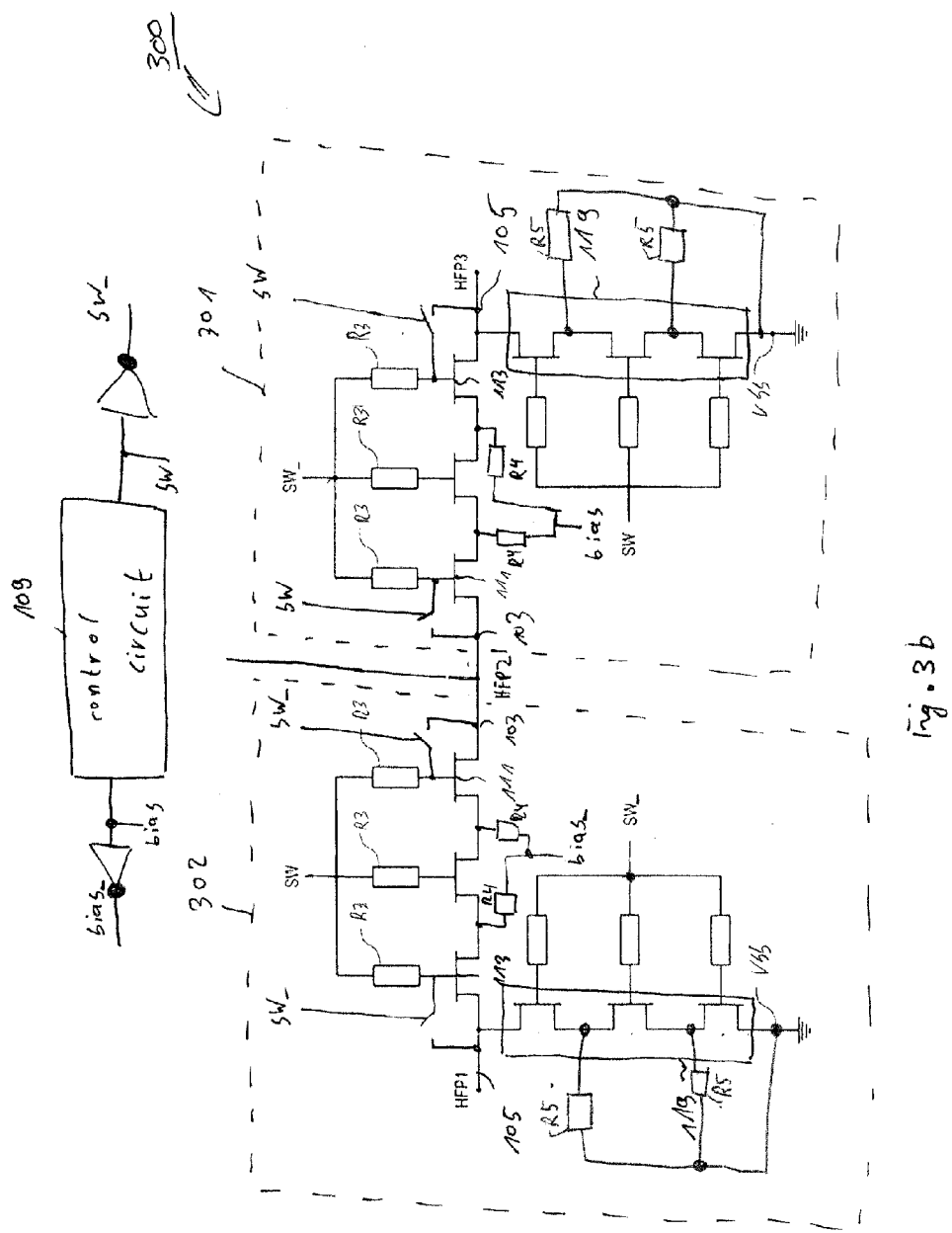
FIG. 3b shows a modification of the RF switch from FIG. 3a according to a further embodiment of the present invention.

FIG. 3b shows a modification of the RF switch 300 from FIG. 3a according to a further embodiment of the present invention. In this embodiment, the inner source drain nodes of the transistors of the shunt paths 119 are pulled to ground potential VSS by means of (high impedance) resistors R5.

The transistors described above may be, for example, field effect transistors (FET), metal oxide semiconductor field effect transistors (MOSFETs), bipolar transistors, high electron mobility transistors (HEMTs), hetero bipolar transistors (HBTs), metal insulator field effect transistors (MISFETs), silicon-on-insulator transistors (SOI) or silicon-on-sapphire transistors (SOS).

A first terminal of a transistor can be, for example, a source terminal or a drain terminal or an emitter terminal or a collector terminal of the transistor. A second terminal can be, for example, a drain terminal or a source terminal or a collector terminal or an emitter terminal of the transistor. A control terminal can be, for example, a gate terminal or a base terminal of the transistor. A channel of the transistor may be a drain source path of the transistor or an emitter collector path of the transistor. Hence, typically, a main transistor current is routed from the first terminal to the second terminal or vice versa.

Although in the examples described above, the transistors are n channel transistors, complementary realizations are possible.

Embodiments of the present invention can be used, for example, in RF switches, or HIPAC-ICs (HIPAC-Highly integrated passive and active components).

FIG. 4 shows a flow diagram of a method 400 according to an embodiment of the present invention. The method 400 for switching RF signals may be performed using an RF switch circuit according to an embodiment of the present invention (e.g., the RF switch circuit 100). In other words, the method 400 may be used for switching RF signals by means of an RF switch circuit comprising a first terminal and a second terminal and a series connection of a plurality of transistors between the first terminal of the RF switch circuit and the second terminal of the RF switch circuit.

The method 400 comprises a step 401 of conductively coupling, in a high impedance state of the RF switch circuit, the first terminal of the RF switch circuit to a control terminal of a first transistor in the series of the series connection of the plurality of transistors and the second terminal of the RF switch circuit to a control terminal of a last transistor in the series of the series connection of the plurality of transistors.

The method 400 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example, a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may, for example, be configured to be transferred via a data communication connection, for example, via the Internet.

A further embodiment comprises a processing means, for example, a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. An RF switch circuit for switching RF signals, the RF switch circuit comprising:
   a first terminal and a second terminal;
   a series connection of a plurality of transistors between the first terminal of the RF switch circuit and the second terminal of the RF switch circuit; and
   a control circuit configured to conductively couple, in a high impedance state of the RF switch circuit, the first terminal of the RF switch circuit to a control terminal of a first transistor in a series of the series connection of the plurality of transistors and the second terminal of the RF switch circuit to a control terminal of a last transistor in the series of the series connection of the plurality of transistors, the control terminal of the first transistor configured to control an impedance of the first transistor and the control terminal of the last transistor configured to control an impedance of the last transistor;
   wherein the first terminal of the RF switch circuit is coupled to a first terminal of the first transistor or is formed by the first terminal of the first transistor, such that, in the high impedance state of the RF switch circuit, the control terminal of the first transistor and the first terminal of the first transistor are shorted; and
   wherein the second terminal of the RF switch circuit is coupled to a second terminal of the last transistor or is formed by the second terminal of the last transistor, such that, in the high impedance state of the RF switch circuit, the control terminal of the last transistor and the second terminal of the last transistor are shorted.

2. The RF switch circuit according to claim 1,
   wherein the control circuit is configured to bias, in the high impedance state of the RF switch circuit, a second terminal of the first transistor and a first terminal of the last transistor with a positive supply potential.

3. The RF switch circuit according to claim 2,
wherein the control circuit is further configured to bias, in the high impedance state of the RF switch circuit, first terminals and second terminals of transistors of the plurality of transistors arranged in the series connection between the first transistor and the last transistor with the positive supply potential.

4. The RF switch circuit according to claim 2,
wherein the control circuit is configured to bring, in a low impedance state of the RF switch circuit, the second terminal of the first transistor and the first terminal of the last transistor into an unbiased state.

5. The RF switch circuit according to claim 4,
wherein the control circuit is further configured to bring, in the low impedance state of the RF switch circuit, first terminals and second terminals of transistors of the plurality of transistors arranged in the series connection between the first transistor and the last transistor, into an unbiased state.

6. The RF switch circuit according to claim 1,
wherein a substrate terminal of a substrate of the plurality of transistors is, in the high impedance state of the RF switch circuit and a low impedance state of the RF switch circuit, conductively coupled to a ground terminal of the RF switch circuit, at which a ground potential is provided.

7. The RF switch circuit according to claim 1,
wherein the control circuit is configured to conductively decouple, in a low impedance state of the RF switch circuit, the first terminal of the RF switch circuit from the control terminal of the first transistor and the second terminal of the RF switch circuit from the control terminal of the last transistor.

8. The RF switch circuit according to claim 1,
wherein the control circuit is configured to apply, in the high impedance state of the RF switch circuit, a positive bias potential to a second terminal of the first transistor; and
wherein the positive bias potential is chosen such that a difference between a maximum RF signal potential at a first terminal of the first transistor and the positive bias potential is smaller than a threshold voltage of the first transistor.

9. The RF switch circuit according to claim 8,
wherein the control circuit is further configured to apply, in the high impedance state of the RF switch circuit, a positive bias potential to a first terminal of the last transistor and a further bias potential to the control terminal of the first transistor and to the control terminal of the last transistor; and
wherein the positive bias potential is chosen such that a difference between the further bias potential and a sum of the positive bias potential and a minimum RF signal potential at the first terminal of the last transistor is smaller than a threshold voltage of the last transistor.

10. The RF switch circuit according to claim 9,
wherein the further bias potential is ground potential.

11. The RF switch circuit according claim 1,
wherein the control circuit is configured to apply, in the high impedance state of the RF switch circuit, a ground potential to a second terminal of the last transistor.

12. The RF switch circuit according to claim 1,
further comprising a further series connection of a further plurality of transistors connected between a second terminal of the last transistor and a ground potential terminal of the RF switch circuit, at which a ground potential is provided.

13. The RF switch circuit according to claim 12,
wherein the control circuit is configured to bring, in the high impedance state of the RF switch circuit, channels of the further plurality of transistors into a conductive state and to bring, in a low impedance state of the RF switch circuit, the channels of the further plurality of transistors into a non-conductive state.

14. The RF switch circuit according to claim 1,
wherein the control circuit is configured to keep, in the high impedance state of the RF switch circuit and in a low impedance state of the RF switch circuit, a first terminal of the first transistor and a second terminal of the last transistor in an unbiased state.

15. The RF switch circuit according to claim 1, further comprising:
a first switching transistor connected between the first terminal of the RF switch circuit and the control terminal of the first transistor; and
a second switching transistor connected between the second terminal of the RF switch circuit and the control terminal of the last transistor.

16. The RF switch circuit according to claim 15,
wherein the control circuit is configured to bring, in the high impedance state of the RF switch circuit, a channel of the first switching transistor and a channel of the second switching transistor into a conductive state; and
wherein the control circuit is further configured to bring, in a low impedance state of the RF switch circuit, the channel of the first switching transistor and the channel of the second switching transistor into a non-conductive state.

17. The RF switch circuit according to claim 1,
wherein the RF switch circuit is configured to route, in a low impedance state of the RF switch circuit, an incoming RF signal from its first terminal to its second terminal or from its second terminal to its first terminal.

18. An RF switch circuit for switching RF signals, the RF switch circuit comprising:
a first terminal and a second terminal;
a series connection of a plurality of transistors between the first terminal of the RF switch circuit and the second terminal of the RF switch circuit;
a first switching transistor and a second switching transistor;
wherein a first terminal of a first transistor in a series of the series connection of the plurality of transistors is connected to the first terminal of the RF switch circuit and a second terminal of a last transistor in the series of the series connection of the plurality of transistors is connected to the second terminal of the RF switch circuit;
wherein a first terminal of the first switching transistor is connected to the first terminal of the first transistor and a second terminal of the first switching transistor is connected to a control terminal of the first transistor;
wherein a first terminal of the second switching transistor is connected to a control terminal of the last transistor and a second terminal of the second switching transistor is connected to the second terminal of the last transistor;
a control circuit coupled to a control terminal of the first switching transistor and a control terminal of the second switching transistor;
wherein the control circuit is configured to bring, in a high impedance state of the RF switch circuit, a channel of the first switching transistor and a channel of the second switching transistor into a conductive state; and
wherein the control circuit is further configured to bring, in a low impedance state of the RF switch circuit, the channel of the first switching transistor and the channel of the second switching transistor into a non-conductive state.

19. A method for switching RF signals by means of an RF switch circuit comprising a first terminal and a second terminal and a series connection of a plurality of transistors between the first terminal of the RF switch circuit and the second terminal of the RF switch circuit, the method comprising:
conductively coupling, in a high impedance state of the RF switch circuit, the first terminal of the RF switch circuit to a control terminal of a first transistor in a series of the series connection of the plurality of transistors and the second terminal of the RF switch circuit to a control terminal of a last transistor in the series of the series connection of the plurality of transistors, the control terminal of the first transistor configured to control an impedance of the first transistor and the control terminal of the last transistor configured to control an impedance of the last transistor;
wherein the first terminal of the RF switch circuit is coupled to a first terminal of the first transistor or is formed by the first terminal of the first transistor, such that, in the high impedance state of the RF switch circuit, the control terminal of the first transistor and the first terminal of the first transistor are shorted; and
wherein the second terminal of the RF switch circuit is coupled to a second terminal of the last transistor or is formed by the second terminal of the last transistor, such that, in the high impedance state of the RF switch circuit, the control terminal of the last transistor and the second terminal of the last transistor are shorted.

20. An RF switch comprising a first RF switch circuit and a second RF switch circuit;
wherein each RF switch circuit comprises a first terminal and a second terminal and wherein each RF switch circuit is configured for switching RF signals;
wherein a first terminal of the RF switch is coupled to the first terminals of the RF switch circuits; and
wherein at least the first RF switch circuit comprises a series connection of a plurality of transistors between its first terminal and its second terminal; and
a control circuit configured to conductively couple, in a high impedance state of the first RF switch circuit, the first terminal of the RF switch to a control terminal of a first transistor in the series of the series connection of the plurality of transistors and the second terminal of the first RF switch circuit to a control terminal of a last transistor in the series of the series connection of the plurality of transistors, the control terminal of the first transistor configured to control an impedance of the first transistor and the control terminal of the last transistor configured to control an impedance of the last transistor;
wherein the first terminal of the first RF switch circuit is coupled to a first terminal of the first transistor or is formed by the first terminal of the first transistor, such that, in the high impedance state of the first RF switch circuit, the control terminal of the first transistor and the first terminal of the first transistor are shorted; and
wherein the second terminal of the first RF switch circuit is coupled to a second terminal of the last transistor or is formed by the second terminal of the last transistor, such that, in the high impedance state of the first RF switch circuit, the control terminal of the last transistor and the second terminal of the last transistor are shorted.

21. A switch for switching RF signals, comprising:
a first terminal and a second terminal;
a series connection of a plurality of switching means between the first terminal of a means for switching RF signals and the second terminal of the means for switching RF signals; and
a means for controlling configured to conductively couple, in a high impedance state of the means for switching RF signals, the first terminal of the means for switching RF signals to a control terminal of a first switching means in a series of the series connection of the plurality of switching means and the second terminal of the means for switching RF signals to a control terminal of a last switching means in the series of the series connection of the plurality of switching means, the control terminal of the first switching means configured to control an impedance of the first switching means and the control terminal of the last switching means configured to control an impedance of the last switching means;
wherein the first terminal of the means for switching RF signals is coupled to a first terminal of the first switching means or is formed by the first terminal of the first switching means, such that, in the high impedance state of an RF switch circuit, the control terminal of the first switching means and the first terminal of the first switching means are shorted; and
wherein the second terminal of the means for switching RF signals is coupled to a second terminal of the last switching means or is formed by the second terminal of the last switching means, such that, in the high impedance state of the means for switching RF signals, the control terminal of the last switching means and the second terminal of the last switching means are shorted.

22. A non transitory storage medium having stored thereon a computer program having a program code for performing, when running on a computer, a method for switching RF signals by means of an RF switch circuit comprising a first terminal and a second terminal and a series connection of a plurality of transistors between the first terminal of the RF switch circuit and the second terminal of the RF switch circuit, the method comprising:
conductively coupling, in a high impedance state of the RF switch circuit, the first terminal of the RF switch circuit to a control terminal of a first transistor in a series of the series connection of the plurality of transistors and the second terminal of the RF switch circuit to a control terminal of a last transistor in the series of the series connection of the plurality of transistors, the control terminal of the first transistor configured to control an impedance of the first transistor and the control terminal of the last transistor configured to control an impedance of the last transistor;
wherein the first terminal of the RF switch circuit is coupled to a first terminal of the first transistor or is formed by the first terminal of the first transistor, such that, in the high impedance state of the RF switch circuit, the control terminal of the first transistor and the first terminal of the first transistor are shorted; and
wherein the second terminal of the RF switch circuit is coupled to a second terminal of the last transistor or is formed by the second terminal of the last transistor, such that, in the high impedance state of the RF switch circuit, the control terminal of the last transistor and the second terminal of the last transistor are shorted.

* * * * *